United States Patent [19]

Shimada et al.

[11] Patent Number: 4,700,455
[45] Date of Patent: Oct. 20, 1987

[54] METHOD OF FABRICATING SCHOTTKY GATE-TYPE GAAS FIELD EFFECT TRANSISTOR

[75] Inventors: Kizashi Shimada, Yokohama; Tatsuo Akiyama, Tokyo; Yutaka Koshino, Yokosuka, all of Japan

[73] Assignee: Kabushiki Kaisha Toshiba, Kawasaki, Japan

[21] Appl. No.: 792,825

[22] Filed: Oct. 30, 1985

[30] Foreign Application Priority Data

Nov. 1, 1984 [JP] Japan ............................. 59-229004

[51] Int. Cl.$^4$ ............................. H01L 21/265
[52] U.S. Cl. ............................. 437/39; 437/41; 437/175
[58] Field of Search ............. 29/571, 576 B, 578, 29/591

[56] References Cited

U.S. PATENT DOCUMENTS

| 4,503,599 | 3/1985 | Ueyanagi et al. | 29/571 |
| 4,532,004 | 7/1985 | Akiyama et al. | 29/571 X |
| 4,546,540 | 10/1985 | Ueyanagi et al. | 29/571 |

OTHER PUBLICATIONS

Denshi Tsushin Gakkai Gijutsu Kenkyu Houkokusho, ED-83-98, Selfaligned Ohmic Contact Technology, S. Takahashi et al. (Hitachi, Ltd.), Jan. 24, 1984, pp. 31–36.

*Primary Examiner*—George T. Ozaki
*Attorney, Agent, or Firm*—Finnegan, Henderson, Farabow, Garrett & Dunner

[57] ABSTRACT

A method of manufacturing a semiconductor device wherein an insulating film of silicon dioxide is provided on the sidewalls of a gate electrode. This silicon dioxide film is used to define the length of the gate region during formation of the source and drain regions by ion implantation, and to accurately position the gate electrode relative to the source and drain regions.

7 Claims, 17 Drawing Figures

METHOD OF FABRICATING SCHOTTKY GATE-TYPE GAAS FIELD EFFECT TRANSISTOR

BACKGROUND OF THE INVENTION

I Field of the Invention

The present invention relates to a method of manufacturing a semiconductor device, and, more particularly, to a method of manufacturing a MES FET which uses a compound semiconductor such as GaAs as a substrate.

II Description of the Prior Art

The following two methods of manufacturing, by self-alignment, a Schottky gate-type field effect transistor (to be referred to as MES FET hereinafter) having a semi-insulating semiconductor substrate of GaAs or the like, are conventionally known:

(1) A method of forming a source region and a drain region by self-alignment with respect to a gate electrode; and (2) A method of forming a source electrode and a drain electrode by self alignment with respect to a gate electrode.

Method (1) will be described with reference to FIGS. 1A to 1D. An n-type impurity such as Si is diffused in a semiconductor substrate 1 of GaAs to form a low impurity concentration region 1a, as shown in FIG. 1A. Thereafter, a gate electrode 2 of a high melting metal such as a TiW alloy is formed on the region 1a. As shown in FIG. 1B, a plasma silicon oxide film (to be referred to as P-SiO₂ film hereinafter) 3 is deposited by plasma CVD on surfaces of the electrode 2 and the substrate 1. A resist film 4 is formed on the film 3 and selectively etched to form an opening at the position corresponding to the region 1a. A donor impurity such as Si is ion-implanted in the substrate 1 through the film 3 exposed in the resist opening. In this case, the electrode 2, a portion of the film 3 at side surfaces of the electrode 2, and the film 4 serve as a mask for ion implantation. In this manner, two high impurity concentration regions 1b are formed, by self-alignment, at positions in the substrate 1 corresponding to the two sides of the electrode 2, with respect to the electrode 2. At the same time, a region 1a, having a length slightly larger than the gate length of the electrode 2, is left immediately thereunder. Then, the film 4 is removed and annealing is performed to activate ions implanted in the regions 1b.

Subsequently, a resist pattern 5 is formed on the film 3, as shown in FIG. 1C. Thereafter, the film 3 on the regions 1b is selectively etched by using the pattern 5 as a mask. An ohmic metal film 6 which can ohmic-contact with the substrate is deposited on the entire surface of the substrate so that it is deposited on the pattern 5 and the regions 1b in the openings of the film 3.

When the pattern 5 is removed, by the lift-off method, together with its overlying film 6 from the film 3, portions of the film 6 deposited on the two regions 1b are left, as shown in FIG. 1D, as a drain electrode 7 and a source electrode 8.

Therefore, according to the method (1), the source and drain regions are formed by self alignment with respect to the gate electrode.

Method (2) will be described with reference to the accompanying drawings FIGS. 2A to 2F. An n-type impurity such as Si is diffused in a semiconductor substrate 1 such as GaAs to form a low impurity concentration region 1a, as shown in FIG. 2A. Thereafter, a gate electrode 2 consisting of a low resistance metal is formed by the lift-off method at substantially a central portion of the region 1a. Subsequently, an insulating film (SiO₂ film) 9 is deposited by thermal CVD on the entire surface of the obtained structure, as shown in FIG. 2B. Then, anisotropic etching such as reactive ion etching (to be referred to as RIE) is performed so that the film 9 is left only on side surfaces of the electrode 2, as shown in FIG. 2C. An ohmic metal film 10 is deposited on the entire surface of the obtained structure, as shown in FIG. 2D. At the same time, a substantially flat resist film 11 is formed on the film 10. Then, in accordance with a combination of anisotropic etching and ion milling, the film 10 on the electrode 2 is levelled through selective etching in order to form a source electrode and a drain electrode as shown in FIG. 2E. When the flat film 11, left after the etching, is removed, the structure shown in FIG. 2F can be obtained. Description of steps following FIG. 2F are omitted. According to the method (2) described with respect to FIGS. 2A to 2F, distances between the electrode 2 and the source and drain electrodes are determined by self-alignment in accordance with the thickness of the film 9 deposited on the side surfaces of the electrode 2. Therefore, mask misalignment in a lithographic step does not occur, so that the distances between the gate electrode and the source and drain electrodes can be precisely controlled.

According to the method (1) described with reference to FIGS. 1A to 1D, the source and drain regions are formed by self-alignment with respect to the gate electrode. However, the source and drain electrode must be formed in accordance with a conventional, photoetching process which uses a photomask. Therefore, the source and drain electrodes cannot be formed by self-alignment. As a result, distances between the gate and the source and drain tend to vary due to mask misalignment. In a GaAs MES FET, the distance between the gate and source influences the resistance of a source series resistor, which in turn influences characteristics of the GaAs MES FET. With method (1), which cannot precisely control the distance between the gate electrode and the drain electrode, a uniform GaAs MES FET having good characteristics cannot be obtained.

Meanwhile, according to method (2), described with respect to FIGS. 2A to 2F, problems inherent in method (1) are solved. However, in this case, since both RIE and ion milling are used in the step for separating the source and drain electrodes, the manufacturing process becomes complex. In addition, when etching is performed on the entire surface of the obtained structure, as shown in FIG. 2E, it is difficult both to determine the time at which etching will end and to separate the source and drain uniformly with respect to all elements in a wafer.

SUMMARY OF THE INVENTION

It is an object of the present invention to provide a method of manufacturing a semiconductor device, wherein source and drain regions can be formed by self alignment with respect to a gate region, and source and drain electrodes (i.e., ohmic electrodes) can be formed by self alignment with respect to a gate electrode.

According to the present invention, there is provided a method of manufacturing a semiconductor device, comprising the steps of:

forming a first impurity region of one conductive type in a compound semiconductor substrate;

forming a metal film and a first insulating film sequentially on a surface of the first impurity region;

selectively etching the metal film and the first insulating film in the same pattern and forming at a substantially central portion of the first impurity region a first electrode consisting of a metal pattern, an upper surface of which is covered with a first insulating film pattern;

forming a second insulating film on an entire surface of the compound semiconductor substrate;

forming a resist pattern having openings at two sides of the first electrode on the second insulating film;

ion-implanting an impurity of one conductive type in the substrate through the second insulating film exposed in the openings by using as a mask the first electrode, a portion of the second insulating film formed on side walls of the first electrode and the resist pattern in order to form second and third impurity regions of higher impurity concentrations than that of the first impurity region, and leaving a portion of the first impurity region between the second and third impurity regions and immediately under the first electrode and portions of the second insulating film on the side walls of the first electrode;

removing the second insulating film by performing anisotropic etching on the entire surface of the compound semiconductor substrate and leaving the second insulating film on the side walls of the first electrode;

forming an ohmic metal film on the entire surface of the compound semiconductor substrate; and removing the resist film together with a portion of the ohmic metal film thereon so as to form self-aligned second and third electrodes on the second and third impurity regions, respectively.

A compound semiconductor substrate of the present invention can comprise GaAs or the like.

It is preferable to use a multi-layer structure consisting of a high melting metal film and a low resistance metal film as a metal film.

The high melting metal film can comprise a refractory metal such as TiW and Mo, a refractory metal nitride such as WN, or a refractory metal silicide such as WSi.

The low resistance metal film can comprise Au.

First and second insulating films can comprise $SiO_2$ films or silicon oxynitride films formed by CVD or sputtering.

A resist pattern can be removed after ion implantation and another resist pattern having the same size can be formed at the same position as the first pattern after annealing.

After self-aligned second and third electrodes are formed, a first insulating film on the first electrode and a second insulating film on a side wall of the first electrode can be removed together with an ohmic metal film on the first insulating film.

According to the present invention as described above, the distances between the gate electrode and source and drain regions are determined in accordance with the thickness of a $P-SiO_2$ film on side surfaces of the gate electrode so that the distances can be precisely controlled. The $P-SiO_2$ film deposited on the side and upper surfaces of the gate electrode is used as a lift-off spacer for the ohmic metal film so that also the source and drain electrodes can be formed by self alignment with respect to the gate electrode. In this manner, a high impurity concentration region, i.e., the source and drain regions can be formed by self alignment with respect to the gate electrode, and the source and drain electrodes can be formed by self alignment with respect to the gate electrode, i.e., the source and drain regions, respectively. As a result, a semiconductor device having superior characteristics to a conventional one can be manufactured at a higher yield without strict mask alignment by a method simpler than a conventional method.

Further, after the second insulating film has been formed, a resist pattern layer may be formed. This pattern layer has openings in the portions located on both sides of the first electrode. In this case, anisotropic etching is applied on the entire structure, and an impurity of the first conductivity type is ion-implanted into the semiconductor substrate, thus forming second and third impurity regions. The resist pattern layer is removed, and a third insulation film is formed on the upper surface of the structure. Thereafter, the whole structure may be subjected to a heat treatment.

In a semiconductor device manufactured by a method of the present invention, gate-source and gate-drain distances are designed more precisely than those of a conventional semiconductor device. Furthermore, the source and drain electrodes are formed by self alignment with respect to the source and drain regions, respectively. Therefore, the source series resistance becomes lower while the breakdown voltage is higher than in a conventional device.

DETAILED DESCRIPTION OF THE PREFERRED EMBODIMENT

A process of manufacturing a MES FET according to an embodiment of the present invention will now be described with reference to FIGS. 3A to 3G.

Figure 1A:
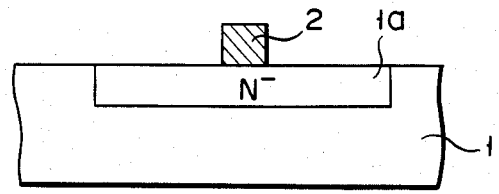
FIGS. 1A to 1D are sectional views showing a conventional process of manufacturing a MES FET.
Figure 1B:
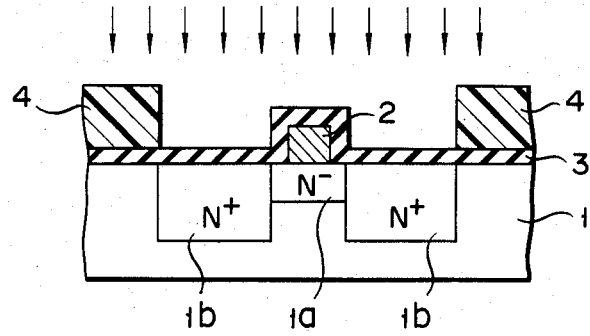
Figure 1C:
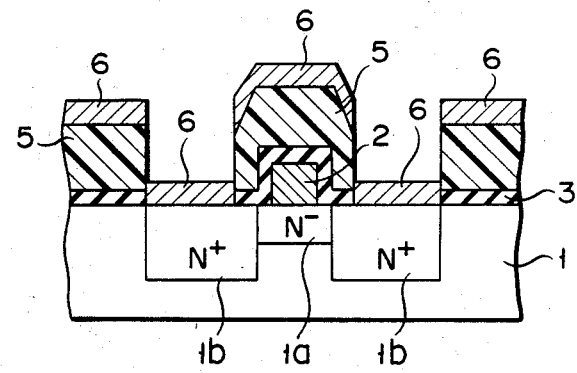
Figure 1D:
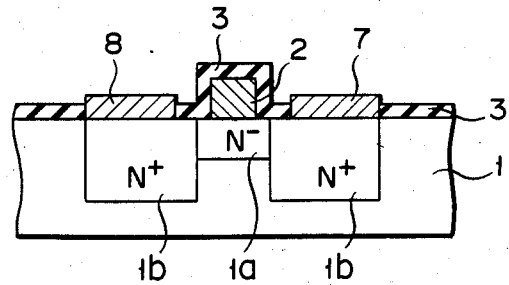
Figure 2A:
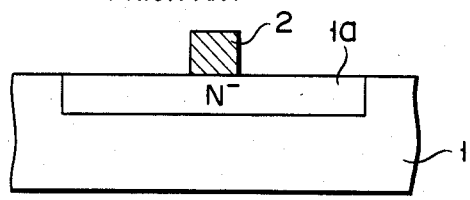
FIGS. 2A to 2F are sectional views showing another conventional process of manufacturing a MES FET.
Figure 2B:
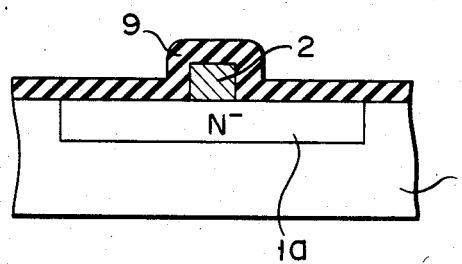
Figure 2C:
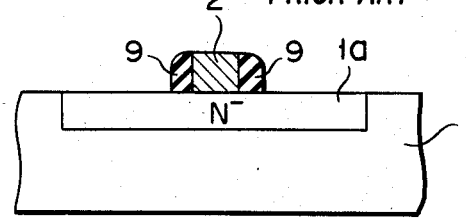
Figure 2D:
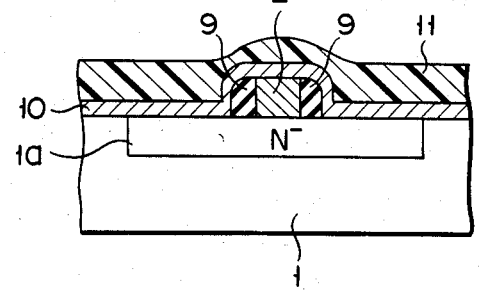
Figure 2E:
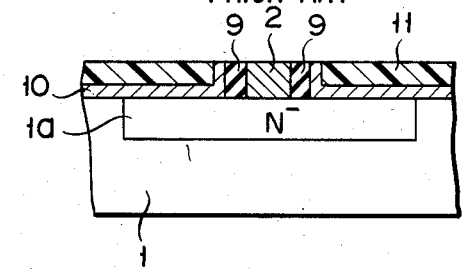
Figure 2F:
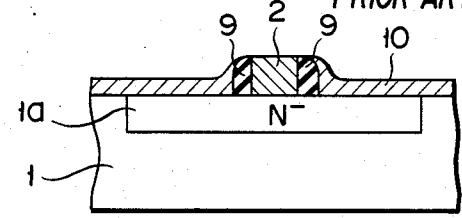
Figure 3A:
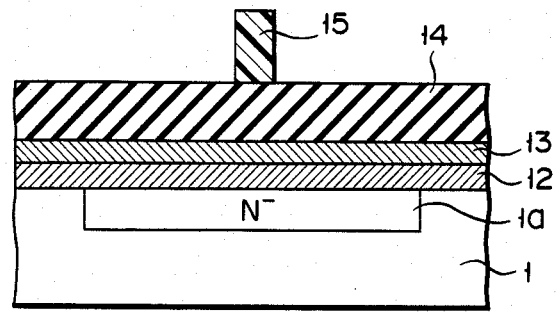
FIGS. 3A to 3G are sectional views showing a process of manufacturing a MES FET according to an embodiment of the present invention.

As shown in FIG. 3A, an n-type impurity is diffused by a known method in a semiconductor substrate 1 of GaAs to form a low impurity concentration region 1a. Thereafter, a TiW film 12 (having a thickness of 0.1 μm) as a high melting metal film and an Au film 13 (having a thickness of 0.5 μm) as a low resistance metal film are successively deposited on the entire surface of the resultant structure. An $SiO_2$ film 14 as an insulating film is deposited (to a thickness of 0.5 μm) on the film 13. After forming a resist film on the film 14 (to a thickness of 1.0 μm), a resist pattern 15 having the same size as a gate electrode is formed thereon.

Figure 3B:
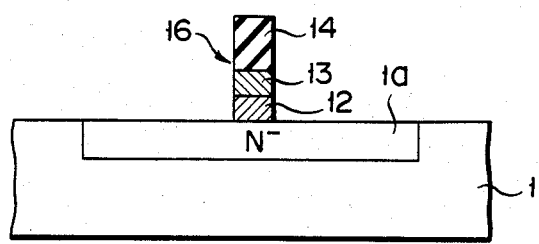

Subsequently, the film 14 is etched by using the pattern 15 as a mask, and the pattern 15 is removed by using an $O_2$ plasma asher. By using a non-etched portion of the film 14 as a mask, the film 13 is etched by ion milling and the film 12 is etched by RIE. Thus, a three-layer structure 16 consisting of the films 12, 13 and 14 is formed on the surface of the region 1a, as shown in FIG. 3B.

Figure 3C:
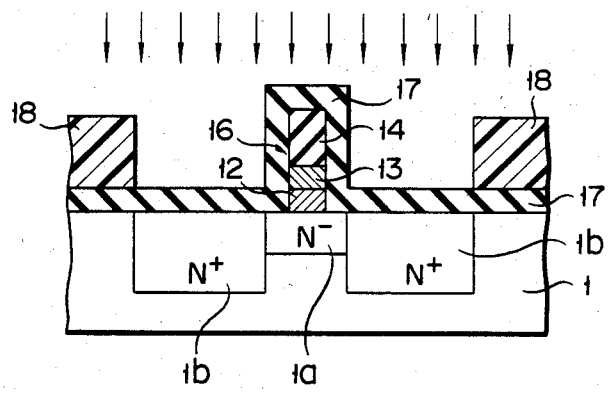

In the next step, a P-SiO₂ film 17 is deposited on the entire surface of the resultant structure as shown in FIG. 3C. Thereafter, a resist pattern 18 (having a thickness of 0.5 μm) as shown in FIG. 3C is formed on the film 17 to form resist openings on the two sides of the structure 16. An n-type impurity such as Si is ion-implanted in the substrate 1 through the film 17 exposed in the resist openings. The structure 16, the P-SiO₂ films on the side surfaces of the structure 16 and the pattern 18 serve as a mask for this ion implantation. Then, the region 1a having the same length as the sum of the length of the structure 16 and the thicknesses of the film 17 at the both side surfaces thereof is left in a portion of the substrate 1 immediately under the structure 16. High impurity concentration regions 1b having sizes such that their outer edges coincide with those of the openings in the resist are formed at the both sides of the region 1a.

Figure 3D:
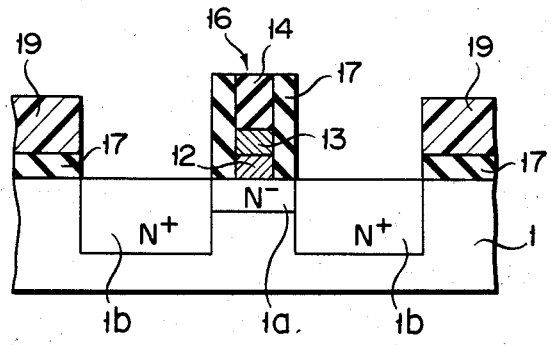

The resist pattern 18 is removed and thereafter annealing is performed in order to activate implanted ions. Then, as shown in FIG. 3D, a resist pattern 19 having the same size as the removed pattern 18 is formed and RIE is performed to remove P-SiO₂ films exposed on the regions 1b, and simultaneously a portion of the film 17 covering the top of the structure 16 is removed.

Figure 3E:
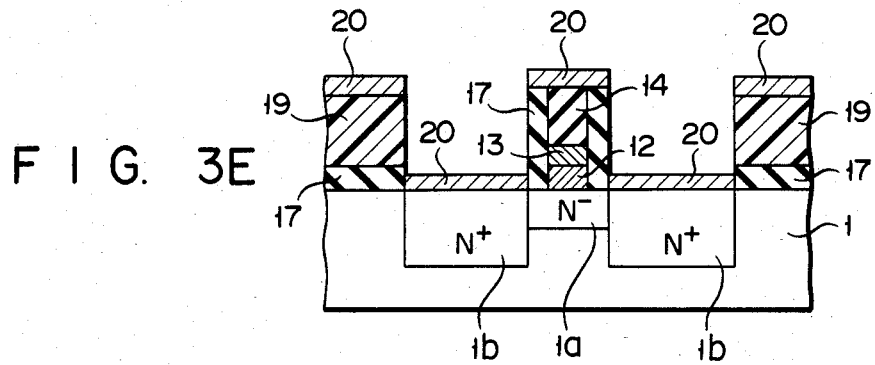
Figure 3F:
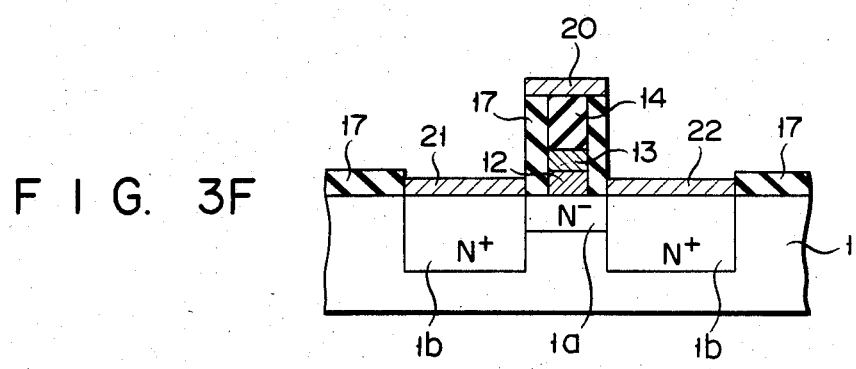

The regions 1b are exposed on both sides of the films 17 on the side surfaces of the structure 16 in the manner as described above. Thereafter, a laminated layer film 20 (having thickness of 0.2 μm) having an AuGe alloy as a lower layer and Ni as an upper layer is deposited as shown in FIG. 3E. The resist pattern 19 is lifted-off together with the film 20 thereon. Then, as shown in FIG. 3F, a source electrode 21 and a drain electrode 22 are formed on the regions 1b, respectively. The film 20 as an ohmic metal film is left on the structure 16. The surface of the substrate 1 excluding the electrodes 21 and 22 and the film 20 is covered with the film 17.

Figure 3G:
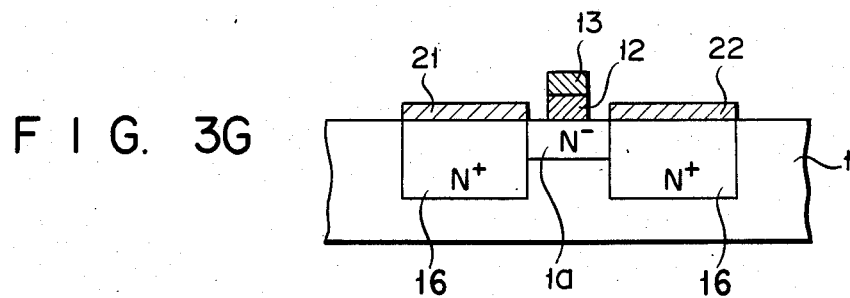

The source and drain electrodes 21 and 22 are annealed and the film 14 overlying on the structure 16 and the overall film 17 are dissolved and removed by a chemical substance such as ammonium fluoride. Then, the film 20 on the structure 16 is lifted-off as shown in FIG. 3G, thereby completing a main portion of the MES FET.

What is claimed is:

1. A method of manufacturing a semiconductor device, comprising the steps of:
   forming a first impurity region of one conductive type in a compound semiconductor substrate;
   forming a metal film and a first insulating film made of silicon dioxide sequentially on a surface of said first impurity region;
   selectively etching said metal film and said first insulating film in the same pattern and forming at a substantially central portion of said first impurity region of first electrode consisting of a metal pattern, an upper surface of which is covered with a first insulating film pattern;
   forming a second insulating film made of silicon dioxide on an entire surface of said compound semiconductor substrate;
   forming a resist pattern having openings at two sides of said first electrode on said second insulating film;
   ion-implanting an impurity of one conductive type in said substrate through said second insulating film exposed in said openings by using as a mask said first electrode, a portion of said second insulating film formed on side walls of said first electrode and said resist pattern in order to form second and third impurity regions of higher impurity concentrations than that of said first impurity region, and leaving a portion of said first impurity region between said second and third impurity regions and immediately under said first electrode and portions of said second insulating film on the side walls of said first electrode;
   removing said second insulating film by performing anisotropic etching on said entire surface of said compound semiconductor substrate and leaving siad second insulating film on the side walls of said first electrode;
   forming an ohmic metal film on said entire surface of said compound semiconductor substrate; and
   removing said resist pattern together with a portion of said ohmic metal film thereon so as to form self-aligned second and third electrodes on said second and third impurity regions, respectively.

2. A method according to claim 1, wherein said compound semiconductor substrate comprises GaAs.

3. A method according to claim 1, wherein said metal film comprises a multi-layer structure consisting essentially of a high melting metal film and a low resistance metal film.

4. A method according to claim 3, wherein said high melting metal film comprises a member selected from the group consisting of a refractory metal, refractory metal nitride and refractory metal silicide, and said low resistance metal film comprises Au.

5. A method according to claim 1, wherein said first and second insulating films are made of SiO₂ or silicon oxynitride.

6. A method according to claim 1, further comprising the steps of:
   removing said resist pattern after said second and third impurity regions are formed;
   performing annealing in order to activate the impurity; and
   forming another resist pattern having the same size as said resist pattern.

7. A method according to claim 1, further comprising the step of:
   removing said second insulating film on said first insulating film on said first electrode and on said side walls of said first electrode together with said ohmic metal film after said self-aligned second and third electrodes are formed.

* * * * *